(12) United States Patent
Subramanian et al.

(10) Patent No.: US 10,884,918 B2
(45) Date of Patent: Jan. 5, 2021

(54) SYSTEM IMPLEMENTATION OF ONE-TIME PROGRAMMABLE MEMORIES

(71) Applicant: INTERNATIONAL BUSINESS MACHINES CORPORATION, Armonk, NY (US)

(72) Inventors: Chitra Subramanian, Putnam, NY (US); Seiji Munetoh, Tokyo (JP); Ghavam Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 27 days.

(21) Appl. No.: 16/260,008

(22) Filed: Jan. 28, 2019

(65) Prior Publication Data

US 2020/0242022 A1 Jul. 30, 2020

(51) Int. Cl.
*G11C 17/00* (2006.01)
*G06F 12/02* (2006.01)
*G11C 17/14* (2006.01)
*G06F 9/38* (2018.01)
*G06F 9/54* (2006.01)

(52) U.S. Cl.
CPC ........ *G06F 12/0246* (2013.01); *G06F 9/3877* (2013.01); *G06F 9/544* (2013.01); *G11C 17/146* (2013.01); *G06F 2212/2142* (2013.01)

(58) Field of Classification Search
CPC .... G06F 12/0246; G06F 9/3877; G06F 9/544; G06F 2212/2142; G11C 17/146

USPC .......................................................... 365/94
See application file for complete search history.

(56) References Cited

U.S. PATENT DOCUMENTS

| | | | |
|---|---|---|---|
| 7,499,353 B2 | 3/2009 | Kim et al. | |
| 9,412,473 B2 | 8/2016 | Chung | |
| 9,606,913 B2 | 3/2017 | Moschopoulos et al. | |
| 9,620,176 B2 | 4/2017 | Wu et al. | |
| 9,666,300 B2 | 5/2017 | Zhang et al. | |
| 9,805,816 B2 | 10/2017 | Jan et al. | |
| 9,905,309 B2 | 2/2018 | Bang et al. | |
| 2013/0070514 A1* | 3/2013 | Weiss | H01L 27/101 365/148 |
| 2014/0219037 A1* | 8/2014 | Mitani | G11C 7/222 365/189.05 |
| 2016/0276042 A1 | 9/2016 | Pesavento et al. | |
| 2017/0337985 A1 | 11/2017 | Borah et al. | |
| 2018/0047736 A1 | 2/2018 | Seo et al. | |
| 2018/0108425 A1 | 4/2018 | Lee et al. | |
| 2018/0137928 A1 | 5/2018 | Qiu et al. | |

* cited by examiner

*Primary Examiner* — Huan Hoang
(74) *Attorney, Agent, or Firm* — Intelletek Law Group, PLLC; Gabriel Daniel, Esq.

(57) ABSTRACT

A semiconductor structure includes a first processor on a first die of a substrate. There is a second processor on a second die of the substrate. There is a one-time programmable (OTP) memory programming circuit, outside of the first and second die, and shared by the first and second processors. Each of the first and second processors include a one-time programmable (OTP) memory. The OTP memory programming circuit is configured to program each OTP memory.

19 Claims, 6 Drawing Sheets

SYSTEM IMPLEMENTATION OF ONE-TIME PROGRAMMABLE MEMORIES

BACKGROUND

Technical Field

The present disclosure generally relates to computer memory, and more particularly to one-time programmable (OTP) memories.

Description of the Related Art

Microprocessor and microcontroller-based systems often involve some form of one-time-programmable (OTP) non-volatile memory to store chip ID numbers, authentication keys, bootloader code and the like. As the size of these systems shrink, minimizing the size of each component is important. The size of OTP memories is dominated by the size of the programming circuit. This is because the programming voltage and current levels are typically high and well outside the normal functional usage range in the field for robust read endurance and data retention over the lifetime of the system. These programming circuits, which include timing circuits and test interface circuits, have an expected use of only one time, namely at a final manufacturing test, to program a permanent code into the bits.

SUMMARY

According to an embodiment of the present disclosure, a processor includes a core arranged in a first region of a first die and a one-time programmable (OTP) memory coupled to the core and arranged on a second region of the first die, wherein OTP memory programming circuits are absent from the first die.

In some embodiments, the processor includes one or more support circuits in a region of the first die and coupled to the OTP memory. The one or more support circuits include a circuit configured to address bits of the OTP memory and a circuit configured to read bits of the OTP memory.

In some embodiments, the first die is coupled to an OTP memory programming circuit outside of the first die but on a same substrate as the first die, and the OTP memory is configured to receive program voltages from the OTP memory programming circuit.

In some embodiments, the OTP memory is further configured to receive program timing signals from the OTP memory programming circuit.

In some embodiments, the OTP memory programming circuit is shared among a plurality of processors on different die but on the same substrate as the first die, where each of the plurality of processors includes an OTP memory that has the OTP memory programming circuit absent from its corresponding die.

In some embodiments, the OTP memory programming circuit is adjacent to a singulation region configured to separate the OTP memory programming circuit from the plurality of processors.

In some embodiments, the singulation region is free from copper metal wiring.

In some embodiments, the OTP memory is coupled to the OTP memory programming circuit by traces comprising aluminum metal.

According to another embodiment of the present disclosure, a semiconductor structure includes a first processor on a first die of a substrate and a second processor on a second die of the substrate. An OTP memory programming circuit, outside of the first and second die, is shared by the first and second processors. Each of the first and second processors includes a one-time programmable (OTP) memory. The OTP memory programming circuit is configured to program each OTP memory.

In some embodiments, the OTP memory of the first processor is adjacent to a first side of the OTP memory programming circuit and the OTP memory of the second processor is adjacent to a second, opposite side of the OTP memory programming circuit.

According to another embodiment of the present disclosure, a method of fabricating a plurality of application specific integrated circuits (ASIC) includes fabricating a plurality of processors, each on a different die on a common semiconductor substrate, wherein each of the plurality of processors includes a core, a static memory, and a one-time programmable (OTP) memory. An OTP memory programming circuit is fabricated on the common semiconductor substrate, outside the die of each of the plurality of processors. The OTP memory of each of the plurality of processors is programmed with the OTP memory programming circuit.

In some embodiments, the method further includes separating the plurality of application specific integrated circuits without producing any exposed copper metal.

In some embodiments, the method further includes fabricating the plurality of processors in at least a first row of processors and a second row of processors.

In some embodiments, the plurality of processors is fabricated in at least a first row of processors and a second row of processors. The OTP memory is fabricated on a first location of each respective die of each processor of the first row of processors, wherein the first location is adjacent to a first side of the OTP memory programming circuit. The OTP memory is fabricated on a second location of each respective die of each processor of the second row of processors, wherein the second location is adjacent to a second side of the OTP memory programming circuit. The first row of processors is a mirror image of the second row of processors.

In some embodiments, the method further includes sharing the OTP memory programming circuit with one or more processors of the first row of processors and one or more processors of the second row of processors.

In some embodiments, the method further includes coupling the OTP memory programming circuit with the OTP memory of each of the plurality of processors with an aluminum metal trace.

In some embodiments, the method further includes separating the plurality of application specific integrated circuits at a singulation region through the aluminum metal, without producing any exposed copper metal.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The area efficiency of OTP memories is generally poor due to the large size of the programming circuitry. By some estimates, a 12% array area efficiency for OTP memories is routinely encountered in the industry. In small systems, such as ones used in internet of things (IOT) applications, this poor OTP area efficiency leads to significant challenges in meeting cost and size targets.

Embodiments of the present disclosure provide OTP memory macros that include circuits that are useful for the system usage in the field but exclude circuits that are configured to generate program voltages, program timing signals, and a test interface to the OTP memory. For example, embodiments of the present disclosure can provide OTP memory macros that include only the read access circuits used for accessing the data in the bits during system usage and circuits used to address the bits during programming, but not programming circuits for one-time use, which include circuits generating the program voltages, program timing signals and the test interface circuits. During the ASIC design, embodiments of the present disclosure can place multiple instances of the processor chips including these OTP memory macros in a group and place a single instance of the programming circuits that can be shared by multiple processor chips to program the individual OTP memories during test. The circuits used for generating the program voltages, timing and test interface are common to multiple OTP memory instances, making the overall cost overhead due to these one-time-program functions significantly lower.

Conventional ASIC chip design uses a programming circuit for each OTP memory of each die. The OTP programming circuits can occupy about 60% of the OTP memory macro area in these conventional designs.

Figure 1:
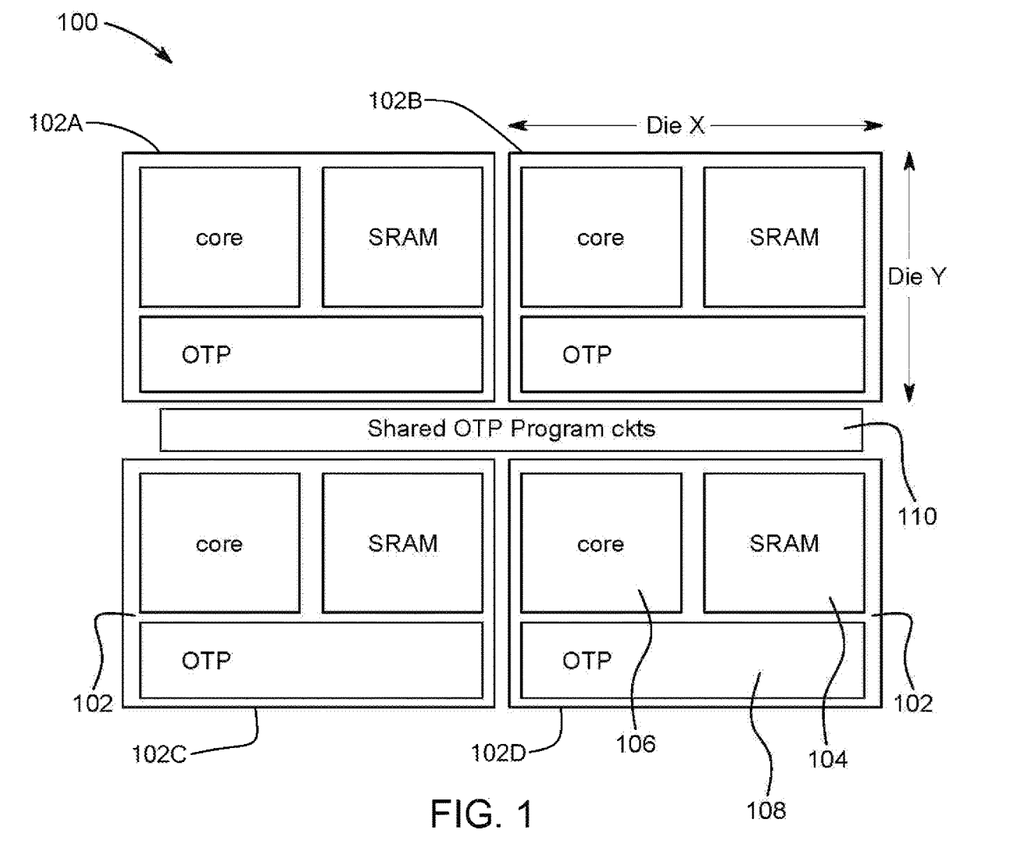
FIG. 1 is a block diagram of an ASIC chip design floorplan with shared OTP memory programming circuits, consistent with an illustrative embodiment.

Referring to FIG. 1, a semiconductor structure 100 is shown having a plurality of processors, where each processor 102 includes static random-access memory (SRAM) 104, a core 106 and OTP memory 108. By way of example only, and not by way of limitation, the semiconductor structure 100 includes four processors. Further, by way of example only and not by way of limitation, each die includes a single processor, while it will be understood that multiple processors and/or multi-core architectures are supported as well. In the example of FIG. 1, each of the processors is on a separate die. Significantly, OTP memory programming circuits 110 can be shared between each die 102A, 102B, 102C, 102D. The result is a substantial decrease in die dimensions due to the removal of the OTP program circuits from each individual die, as discussed in more detail below in the context of FIGS. 5 and 6.

The OTP memory programming circuits 110 can include one or more support circuits coupled to the OTP memory. The one or more support circuits can include, as non-limiting examples, a circuit configured to address bits of the OTP memory and a circuit configured to read bits of the OTP memory.

In some embodiments, the OTP memory is formed with only read-access circuit elements present on each die. In various embodiments, the multiple processors 102 can be programmed either in series, where each processor 102 in the four processor semiconductor structure 100 can be specifically addressed, or in parallel, where common settings are programmed into multiple ones of the processors 102.

Figure 2:
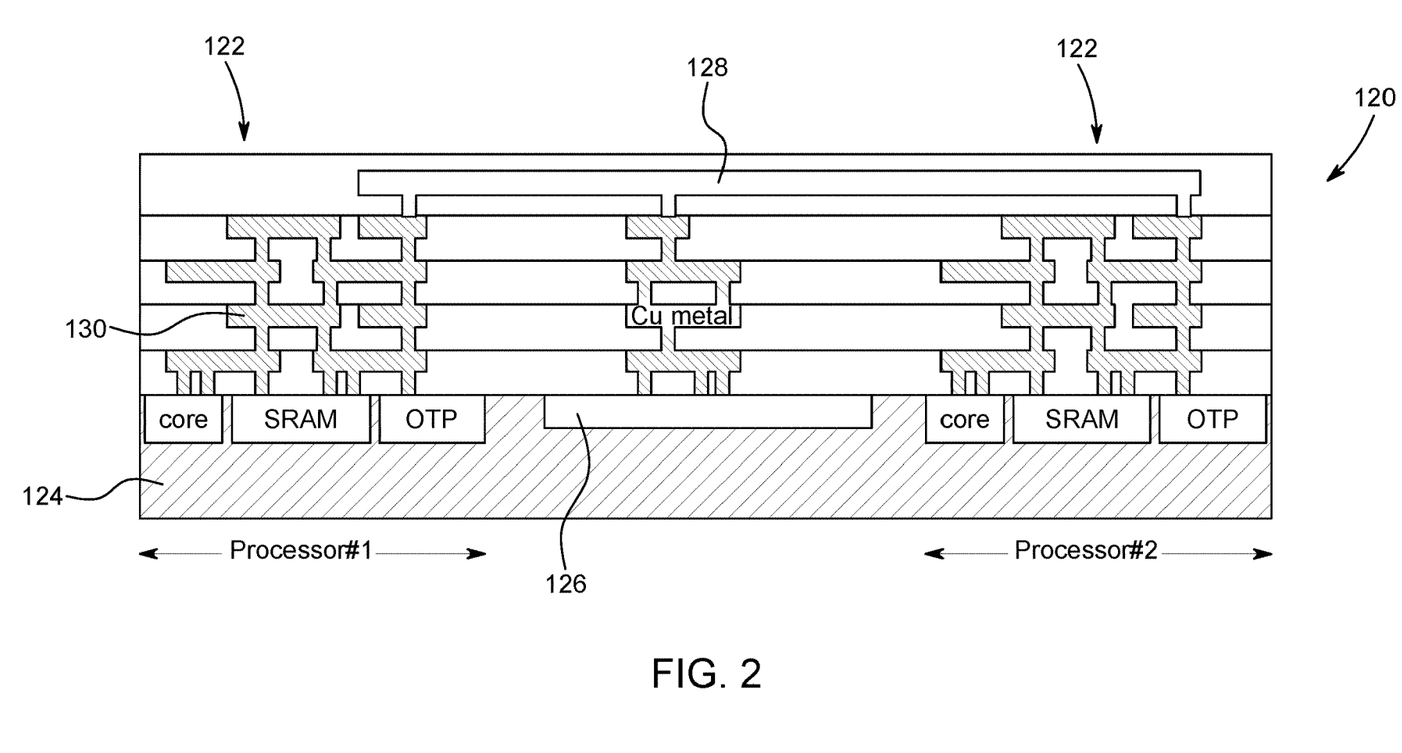
FIG. 2 is a chip cross-section view of an ASIC chip design with shared OTP memory programming circuits, consistent with an illustrative embodiment.
Figure 3:
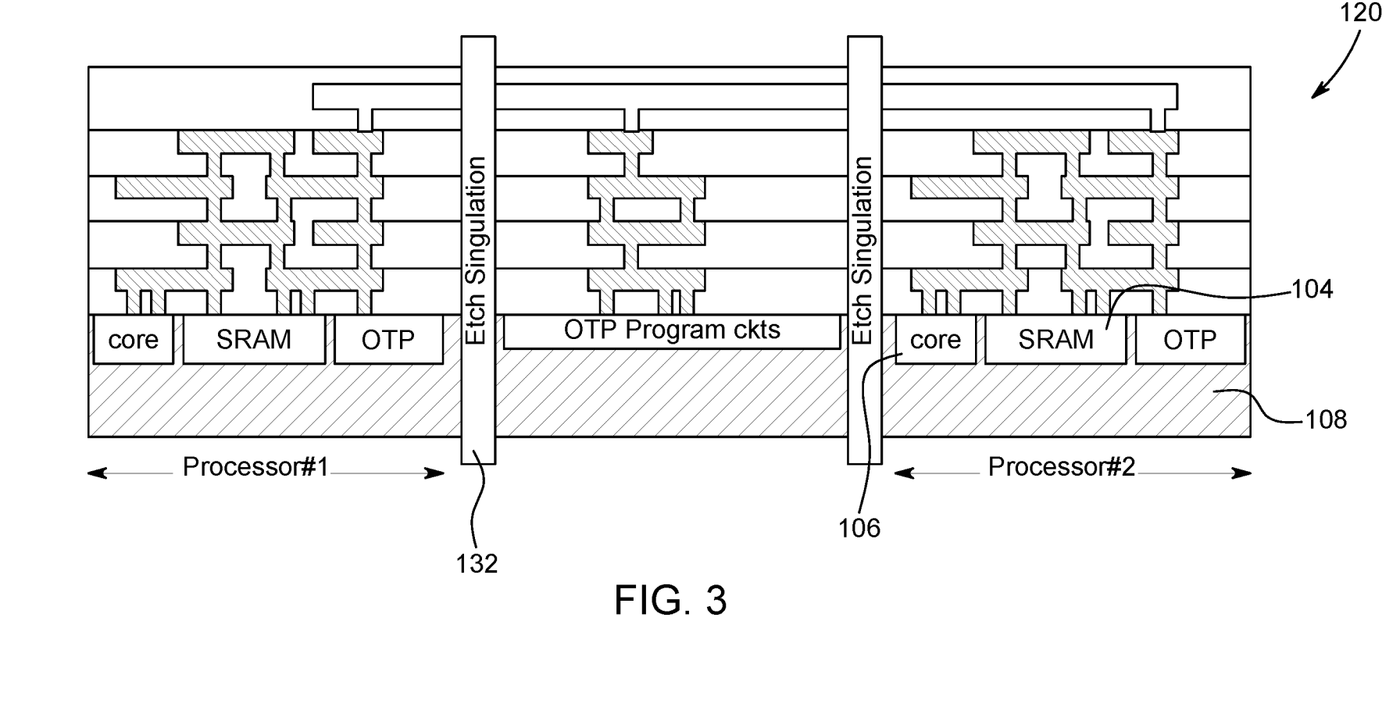
FIG. 3 is a chip cross-section view of an ASIC chip design with shared OTP memory programming circuits separated by etch singulation for packaging, consistent with an illustrative embodiment.

Referring now to FIGS. 2 and 3, a semiconductor structure 120 having multiple processors 122 can be built on adjacent locations on a semiconductor substrate, such as a silicon substrate 124. A common OTP memory programming circuit 126 can be positioned to be shared among multiple ones of the multiple processors 122. In some embodiments, the common OTP memory programming circuit 126 can be connected to the multiple ones of the multiple processors 122 in an upper aluminum metal layer 128. Accordingly, in some embodiments, there are no connections in the lower copper metal layers 130 of the multiple processor semiconductor structure 120.

Referring specifically to FIG. 3, the OTP memory 108 for each of the multiple processors 122 can be programmed at a wafer level test. Once complete, the multiple processor semiconductor structure 120 can be separated at an etch singulation region 132 into separate die for packaging. In some embodiments, the etch singulation region 132 is free from copper metal. Thus, upon separation, in some embodiments, there is no exposed copper metal after singulation, only exposed aluminum, which does not have issues of corrosion that may be present with exposed copper.

Figure 4:
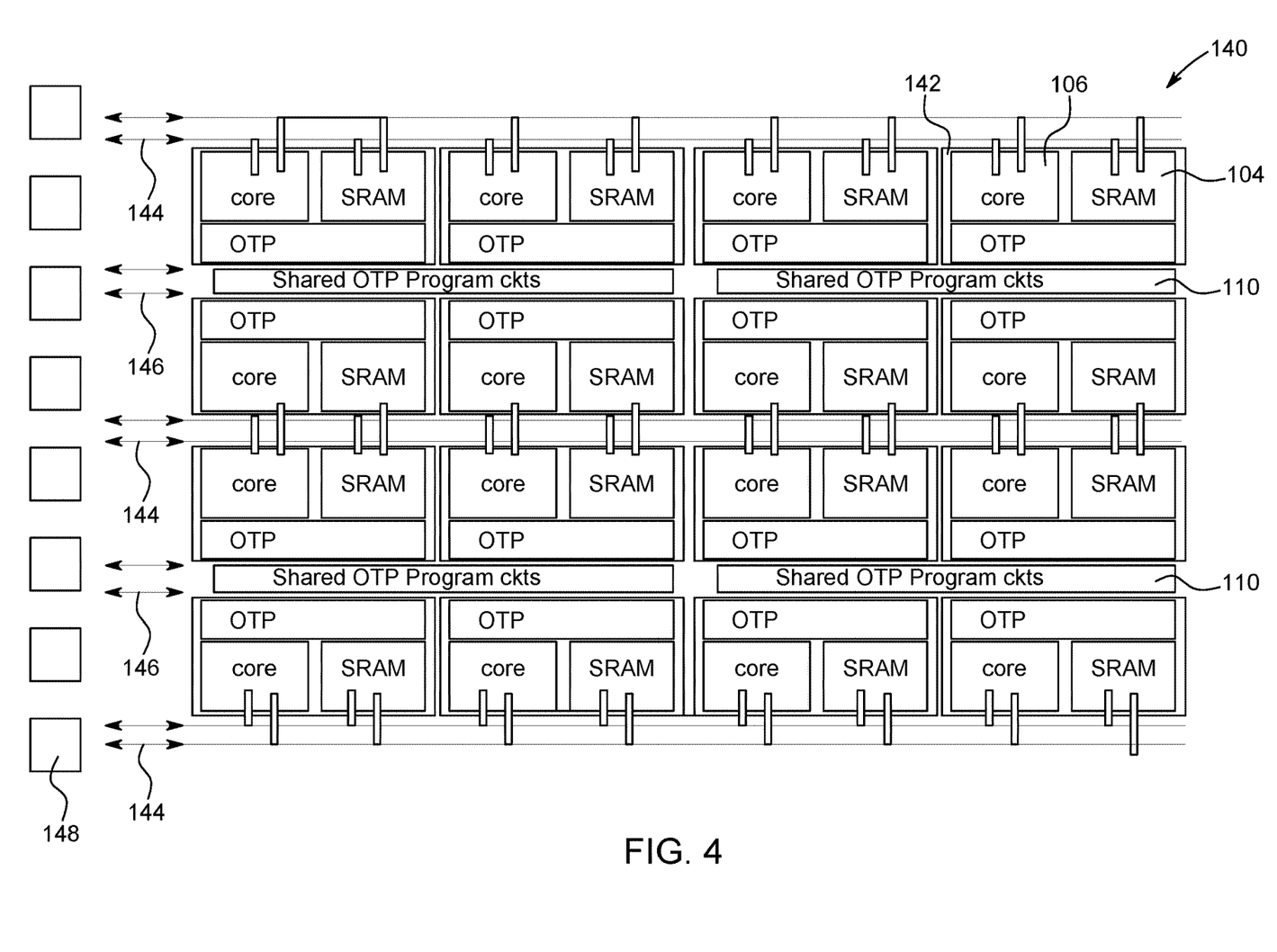
FIG. 4 is a block diagram of a sixteen processor die ASIC chip design floorplan with shared OTP memory programming circuits and shared core and SRAM test signal routing channels, consistent with an illustrative embodiment.

Referring to FIG. 4, a sixteen processor semiconductor structure 140 can be designed similarly to the four processor semiconductor structure 100 described above with reference to FIG. 1. The OTP memory programming circuits 110 can be shared with adjacent sets of four processors 142. In each of the processors 142, the adjacent OTP memories 108 can share a common routing channel 146 for programming power and control signal lines. The cores 106 and SRAM 104 of adjacent processors 142 can share a common routing channel 144 for other test related signals. Test pads 148 may be provided for coordinating the test signals and programming power supply and control signal lines.

As shown in FIG. 4, to accommodate this sharing of routing channels 144, 146, in some embodiments, the adjacent ones of the processors 142 may be configured as mirror images. That is, the OTP memories 108 of the processors 142 may be structured to be positioned adjacent the OTP memory programming circuit 110 and the routing channel 146. Further, the cores 106 and SRAM 104 of the processors 142 may be structured to be positioned adjacent the routing channel 144, where, in the embodiment of FIG. 4, four or eight processors 142 may share a common routing channel 144 for core and/or SRAM test signals. Of course, the architecture of FIG. 4 illustrates one possible embodiment for the arrangement of individual processor dies in the chip design floorplan and other orientations are contemplated within the scope of the present disclosure, provided that the OTP memory programming circuits are shared between two or more processors fabricated on the same reticle.

Figure 5:
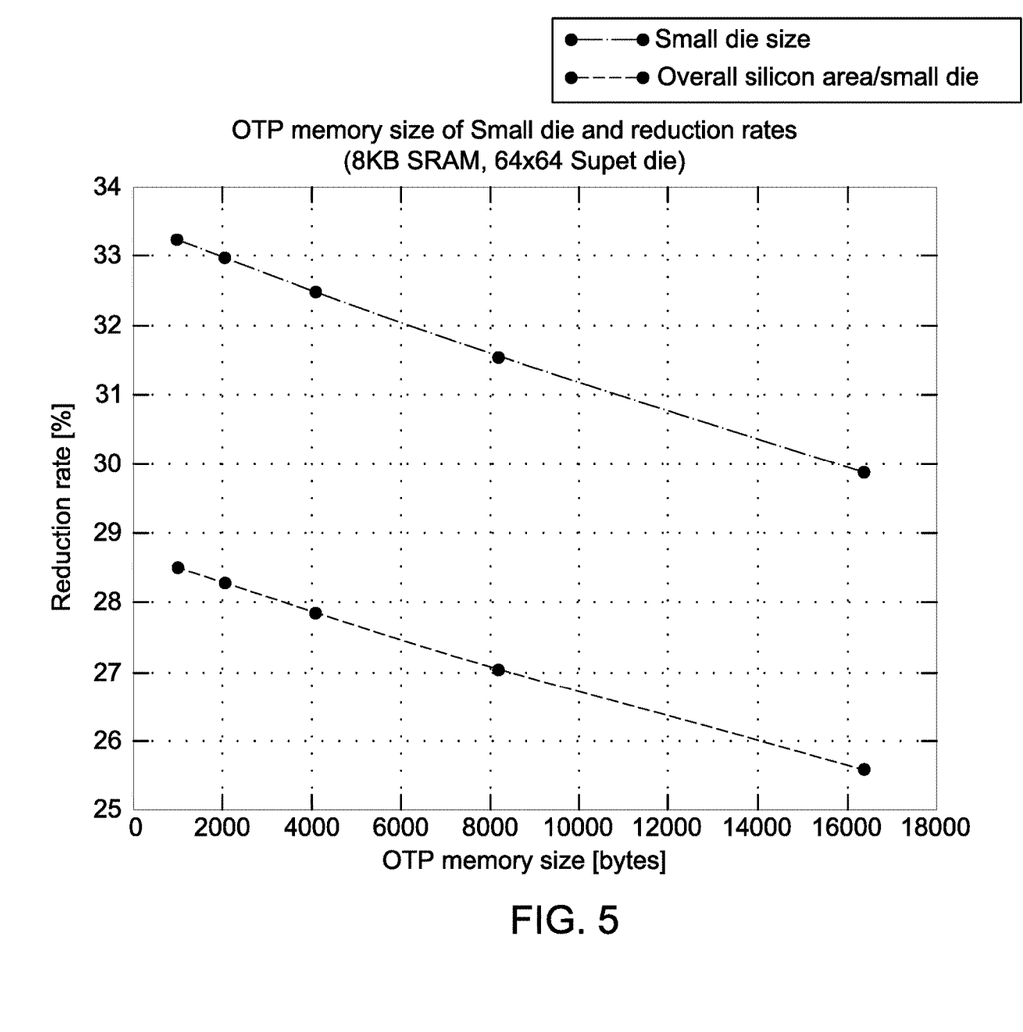
FIG. 5 is a graph of an estimation of the area reduction of ASIC chip size and of overall silicon utilization, as a function of OTP memory size, by sharing OTP memory programming circuits, consistent with an illustrative embodiment.
Figure 6:
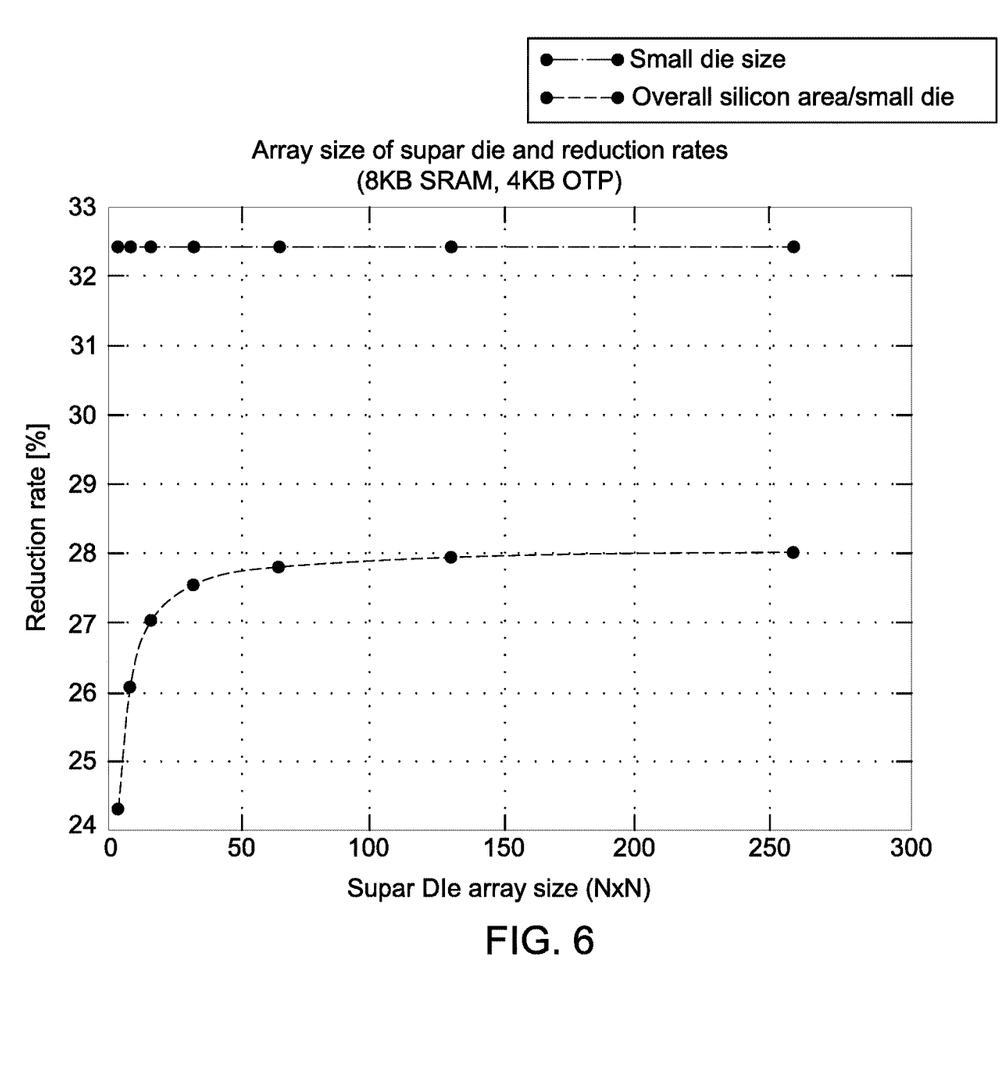
FIG. 6 is a graph of an estimation of the area reduction of ASIC chip size and overall silicon utilization, as a function of super die array size, by sharing OTP memory programming circuits, consistent with an illustrative embodiment.

Referring to FIGS. 5 and 6, the graphs illustrate an estimation of the area reduction by sharing OTP memory programming circuits according to embodiments of the present disclosure. In FIG. 5, an area reduction rate is graphed against OTP memory size, where the ASIC area can be reduced from over 33% for relatively small OTP memory size (for example, at about 1024 bytes) to about 30% for larger OTP memory size (for example, at about 16384 bytes). The utilization of silicon area, including the OTP programming circuits, test pads and dicing parts, can be reduced from about 28.5% for relatively small OTP memory size to about 25.5% for relatively large OTP memory size. As can be seen, the smaller the OTP memory size, the greater the effect of the size reduction.

In FIG. 6, an area reduction rate is graphed against super die array size, where the ASIC area is reduced over 32%, regardless of the size of the die array. The utilization of silicon area, including the OTP programming circuits, test pads and dicing parts, increases for smaller die array sizes, such as sizes below a 50×50 die array, and reaches a maximum area reduction at about 28% for a die array size greater than about 100×100.

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A processor comprising:
   a core arranged in a first region of a first die;
   a one-time programmable (OTP) memory coupled to the core and arranged on a second region of the first die, wherein OTP memory programming circuits are absent from the first die; and
   an OTP memory programming circuit shared among a plurality of processors on different die from the first die but on the same substrate as the first die, wherein each of the plurality of processors includes an OTP memory that has the OTP memory programming circuit absent from its corresponding die.

2. The processor of claim 1, further comprising one or more support circuits in a region of the first die and coupled to the OTP memory, the one or more support circuits comprising:
   a circuit configured to address bits of the OTP memory; and
   a circuit configured to read bits of the OTP memory.

3. The processor of claim 1, wherein:
   the first die is coupled to the OTP memory programming circuit outside of the first die but on a same substrate as the first die; and
   the OTP memory of the first die is configured to receive program voltages from the OTP memory programming circuit.

4. The processor of claim 3, wherein the OTP memory is further configured to receive program timing signals from the OTP memory programming circuit.

5. The processor of claim 1, wherein the OTP memory programming circuit is adjacent to a singulation region configured to separate the OTP memory programming circuit from the plurality of processors.

6. The processor of claim 5, wherein the singulation region is free from copper metal wiring.

7. The processor of claim 3, wherein the OTP memory is coupled to the OTP memory programming circuit by traces comprising aluminum metal.

8. A semiconductor structure comprising:
   a first processor on a first die of a substrate;
   a second processor on a second die of the substrate; and
   an one-time programmable (OTP) memory programming circuit, outside of the first and second die, and shared by the first and second processors, wherein:
   each of the first and second processors include an OTP memory; and
   the OTP memory programming circuit is configured to program each OTP memory.

9. The semiconductor structure of claim 8, wherein:
   the OTP memory of the first processor is adjacent to a first side of the OTP memory programming circuit; and
   the OTP memory of the second processor is adjacent to a second, opposite side of the OTP memory programming circuit.

10. The semiconductor structure of claim 8, wherein the OTP memory programming circuit is shared among a plurality of additional processors.

11. The semiconductor structure of claim 8, wherein each OTP memory is coupled to the OTP memory programming circuit by traces comprising aluminum metal.

12. The semiconductor structure of claim 11, wherein the OTP memory programming circuit is adjacent to a singulation region configured to separate the OTP memory programming circuit from the first and second die of the first and second processors.

13. The semiconductor structure of claim 12, wherein the singulation region is free from copper metal wiring.

14. A method of fabricating a plurality of application specific integrated circuits (ASIC), the method comprising:
   fabricating a plurality of processors, each on a different die on a common semiconductor substrate, wherein each of the plurality of processors includes a core, a static memory, and a one-time programmable (OTP) memory;
   fabricating an OTP memory programming circuit on the common semiconductor substrate, outside the die of each of the plurality of processors; and
   programming the OTP memory of each of the plurality of processors with the OTP memory programming circuit.

15. The method of claim 14, further comprising separating the plurality of application specific integrated circuits without producing any exposed copper metal.

16. The method of claim 14, further comprising:
   fabricating the plurality of processors in at least a first row of processors and a second row of processors;
   fabricating the OTP memory on a first location of each respective die of each processor of the first row of processors, the first location adjacent to a first side of the OTP memory programming circuit; and
   fabricating the OTP memory on a second location of each respective die of each processor of the second row of processors, the second location adjacent a second side of the OTP memory programming circuit, wherein:
   the first row of processors is a mirror image of the second row of processors.

17. The method of claim 16, further comprising sharing the OTP memory programming circuit with one or more processors of the first row of processors and one or more processors of the second row of processors.

18. The method of claim 14, further comprising coupling the OTP memory programming circuit with the OTP memory of each of the plurality of processors with an aluminum metal trace.

19. The method of claim 18, further comprising separating the plurality of application specific integrated circuits at a singulation region through the aluminum metal, without producing any exposed copper metal.

* * * * *